(12) United States Patent
Baek et al.

(10) Patent No.: US 11,730,033 B2
(45) Date of Patent: Aug. 15, 2023

(54) DISPLAY DEVICE

(71) Applicant: SAMSUNG DISPLAY CO., LTD., Yongin-si (KR)

(72) Inventors: Gyung Min Baek, Yongin-si (KR); Hyun Eok Shin, Gwacheon-si (KR); Ju Hyun Lee, Seongnam-si (KR); Hong Sick Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 17/331,527

(22) Filed: May 26, 2021

(65) Prior Publication Data
US 2022/0020842 A1  Jan. 20, 2022

(30) Foreign Application Priority Data
Jul. 20, 2020 (KR) .................. 10-2020-0089589

(51) Int. Cl.
| | | |
|---|---|---|
| *H10K 59/131* | (2023.01) | |
| *H10K 59/126* | (2023.01) | |
| *H10K 59/38* | (2023.01) | |
| *H10K 71/00* | (2023.01) | |
| *H10K 59/12* | (2023.01) | |
| *H10K 59/123* | (2023.01) | |

(52) U.S. Cl.
CPC ....... *H10K 59/1315* (2023.02); *H10K 59/126* (2023.02); *H10K 59/38* (2023.02); *H10K 71/00* (2023.02); *H10K 59/1201* (2023.02)

(58) Field of Classification Search
CPC .. H01I 27/3279; H01I 27/322; H01I 27/3272; H01I 27/1255; H01I 51/56; H01I 51/5206; H01I 51/5221
See application file for complete search history.

(56) References Cited

U.S. PATENT DOCUMENTS

| | | | |
|---|---|---|---|
| 7,994,708 B2* | 8/2011 | Choi | H01L 27/3276 |
| | | | 313/504 |
| 2007/0126939 A1* | 6/2007 | Jung | H01L 29/41733 |
| | | | 349/1 |
| 2011/0013105 A1* | 1/2011 | Jung | G02F 1/13624 |
| | | | 438/34 |
| 2016/0223874 A1* | 8/2016 | Son | G02F 1/134309 |
| 2017/0338438 A1* | 11/2017 | Kwon | H01L 51/5016 |
| 2019/0051854 A1* | 2/2019 | Yasukawa | H01L 51/524 |
| 2019/0206979 A1* | 7/2019 | Han | H10K 59/88 |

(Continued)

FOREIGN PATENT DOCUMENTS

| | | |
|---|---|---|
| JP | 2010-258347 A | 11/2010 |
| JP | 2016-224634 A | 12/2016 |

(Continued)

*Primary Examiner* — Mohsen Ahmadi
(74) *Attorney, Agent, or Firm* — Lewis Roca Rothgerber Christie LLP

(57) ABSTRACT

A display device includes: a substrate; a data line on the substrate; a first insulating layer on the data line; a first transistor on the first insulating layer; a second insulating layer on the first transistor; a pixel electrode on the second insulating layer, the pixel electrode being electrically connected to the first transistor; and an auxiliary data pattern on the second insulating layer as a same layer as the pixel electrode, the auxiliary data pattern being electrically connected to the data line.

18 Claims, 18 Drawing Sheets

(56) References Cited

U.S. PATENT DOCUMENTS

| | | | |
|---|---|---|---|
| 2020/0111413 A1* | 4/2020 | Park | G09G 3/3677 |
| 2020/0185489 A1* | 6/2020 | Jo | H10K 59/1315 |
| 2020/0381507 A1* | 12/2020 | Park | H10K 59/1216 |
| 2020/0395428 A1 | 12/2020 | Baek et al. | |
| 2021/0126016 A1* | 4/2021 | Li | H01L 29/78633 |
| 2021/0134851 A1* | 5/2021 | Jeon | H01L 27/1288 |
| 2021/0143189 A1* | 5/2021 | Kim | H01L 27/1274 |
| 2021/0265579 A1* | 8/2021 | Lee | H01L 51/5256 |
| 2022/0059630 A1* | 2/2022 | Cho | H01L 51/0018 |
| 2022/0149137 A1* | 5/2022 | Wang | H01L 27/1255 |

FOREIGN PATENT DOCUMENTS

| | | |
|---|---|---|
| KR | 10-2011-0072841 A | 6/2011 |
| KR | 10-2012-0106192 A | 9/2012 |
| KR | 10-2016-0141315 A | 12/2016 |

\* cited by examiner

DISPLAY DEVICE

CROSS-REFERENCE TO RELATED APPLICATION

This application claims priority to and the benefit of Korean Patent Application No. 10-2020-0089589 filed in the Korean Intellectual Property Office (KIPO) on Jul. 20, 2020, the entire content of which is incorporated herein by reference.

BACKGROUND

1. Field

The present disclosure generally relates to a display device.

2. Description of the Related Art

A display device may be formed by depositing and patterning several layers on a substrate. The patterning of the layers may be performed by a photolithography process using a photomask. Different masks may be used for patterning each layer, and a number of photomasks corresponding to the number of layers to be patterned may be used. Therefore, the manufacturing cost of the display device may be reduced by designing the display device to reduce the number of photomasks used to form the display device.

The above information disclosed in this Background section is only for enhancement of understanding of the background, and therefore it may contain information that is not prior art.

SUMMARY

Aspects of one or more embodiments are directed towards a display device capable of preventing, reducing, or minimizing electrical and physical characteristic deterioration while reducing the number of the used photomasks in the manufacture of the display devices.

A display device according to an embodiment includes: a substrate; a data line on the substrate; a first insulating layer on the data line; a first transistor on the first insulating layer; a second insulating layer on the first transistor; a pixel electrode on the second insulating layer, the pixel electrode being electrically connected to the first transistor; and an auxiliary data pattern on the second insulating layer as a same layer as the pixel electrode, the auxiliary data pattern being electrically connected to the data line.

The display device may further include: a first connecting member on the first insulating layer, the first connecting member being connected to an electrode of the first transistor; and a third insulating layer between the first connecting member and the second insulating layer. The pixel electrode is connected to the first transistor through the first connecting member.

The display device may further include a light blocking layer between the substrate and the first insulating layer, the light blocking layer overlapping a channel region of the first transistor. The first connecting member may be connected to the light blocking layer.

The display device may further include: a second transistor on the first insulating layer; and a second connecting member between the first insulating layer and the third insulating layer, the second connecting member being connected to an electrode of the second transistor and the data line. The auxiliary data pattern may be connected to the data line through the second connecting member.

The auxiliary data pattern may be connected to the second connecting member through a contact hole formed in the third insulating layer.

The display device may further include: a light blocking layer between the substrate and the first insulating layer, the light blocking layer overlapping a channel region of the first transistor; and a first bridge on the second insulating layer as a same layer as the pixel electrode, the first bridge being connected to the pixel electrode, an electrode of the first transistor, and the light blocking layer.

The display device may further include: a second transistor on the first insulating layer; and a second bridge on the same layer as the pixel electrode on the second insulating layer, the second bridge being connected to an electrode of the second transistor and the data line.

The display device may further include a third bridge on the second insulating layer as a same layer as the pixel electrode, the third bridge being connected to an other electrode of the first transistor and an other electrode of the second transistor.

The pixel electrode and the auxiliary data pattern may include a plurality of layers, and at least one layer from among the plurality of layers may include copper.

The plurality of layers may include a first layer, a second layer, a third layer, a fourth layer, and a fifth layer sequentially on the second insulating layer. The second layer may include copper.

The first layer may include titanium or a copper alloy. The third layer may include titanium. The fourth layer may include silver. The fifth layer may include a transparent conductive oxide.

A display device according to an embodiment includes: a substrate; a first conductor on the substrate, the first conductor including a light blocking layer and a data line; a first insulating layer on the first conductor; a semiconductor layer on the first insulating layer; a second insulating layer on the semiconductor layer; a second conductor on the second insulating layer, the second conductor including a first gate electrode and a second gate electrode; a third insulating layer on the second conductor; a fourth insulating layer on the third insulating layer; and a third conductor on the fourth insulating layer, the third conductor including a pixel electrode and an auxiliary data pattern. The pixel electrode may be electrically connected to the light blocking layer, and the auxiliary data pattern may be electrically connected to the data line.

The display device may further include: a first transistor between the first insulating layer and the third insulating layer, the first transistor including a part of the semiconductor layer and the first gate electrode; a second transistor between the first insulating layer and the third insulating layer, the second transistor including a part of the semiconductor layer and the second gate electrode; and a first connecting member between the first insulating layer and the third insulating layer, the first connecting member being connected to an electrode of the first transistor. The pixel electrode may be connected to the electrode of the first transistor through the first connecting member.

The first connecting member may be connected to the light blocking layer through a contact hole formed in the first insulating layer. The pixel electrode may be connected to the first connecting member through a contact hole formed in the third insulating layer and the fourth insulating layer.

The display device may further include a second connecting member between the first insulating layer and the third insulating layer and connected to an electrode of the second transistor. The auxiliary data pattern may be connected to the data line through the second connecting member.

The second connecting member may be connected to the data line through a contact hole formed in the first insulating layer. The auxiliary data pattern may be connected to the second connecting member through a contact hole formed in the third insulating layer and the fourth insulating layer.

The third conductor may further include a first bridge connected to the electrode of the first transistor and the light blocking layer; and a second bridge connected to an electrode of the second transistor and the data line.

The third conductor may include a first layer, a second layer, a third layer, a fourth layer, and a fifth layer sequentially located on the fourth insulating layer. The second layer may include copper.

The first layer may include titanium or a copper alloy. The third layer may include titanium. The fourth layer may include silver. The fifth layer may include a transparent conductive oxide.

The display device may further include: a fifth insulating layer on the third conductor, the fifth insulating layer having an opening overlapping the pixel electrode; an emission layer on the pixel electrode; and a common electrode on the emission layer.

According to embodiments, it is possible to prevent, reduce, or minimize electrical and physical characteristic deteriorations of the display device while reducing the number of photomasks used in the manufacture of the display device. In addition, according to embodiments, it is possible to provide an advantageous effect that may be recognized throughout the specification.

DETAILED DESCRIPTION

Figure 1:
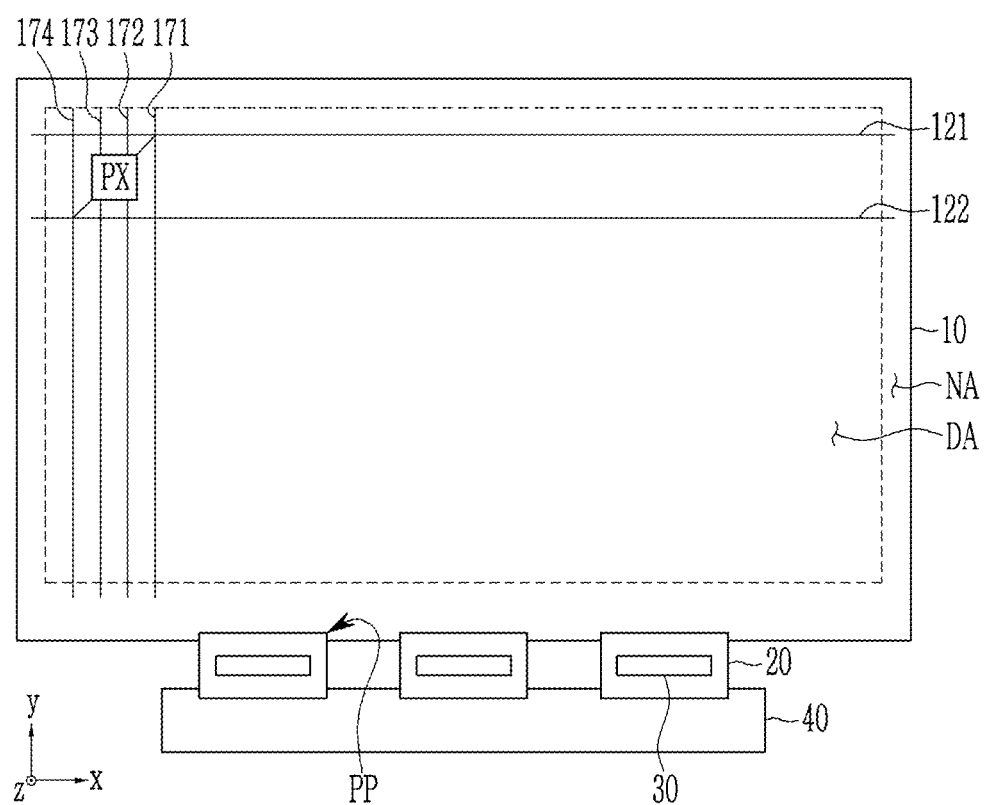
FIG. 1 is a top plan view schematically showing a display device according to an embodiment.

Embodiments will be described in more detail with reference to accompanying drawings so that those skilled in the art to which the present disclosure belongs can easily implement them.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, sizes and thicknesses of constituent members shown in the accompanying drawings are given for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the words "include" and "comprise" and variations thereof such as "includes," "including," "comprises" or "comprising" will be understood to imply the inclusion of stated elements but not the exclusion of any other elements.

Throughout the specification, "connected" does not only refer to two or more constituent elements being directly connected, but also two or more constituent elements being connected indirectly through other constituent elements. Further, "connected" may include a case where substantially integral parts are connected to each other even if they may be referred to by a different name depending on the position or function, as well as the case of being physically connected or electrically connected.

In the drawings, symbols "x", "y", and "z" representing a direction are used, where "x" is a first direction, "y" is a second direction perpendicular to the first direction, and "z" is a third direction perpendicular to the first direction and the second direction. The first direction x, the second direction y, and the third direction z may correspond to a horizontal direction, a vertical direction, and a thickness direction of the display device, respectively.

Unless otherwise specified in the specification, "overlapping" refers to overlapping in a plan view and overlapping in the third direction z.

FIG. 1 is a top plan view schematically showing a display device according to an embodiment.

Referring to FIG. 1, the display device may include a display panel 10, a flexible printed circuit film 20, an integrated circuit chip 30, and a printed circuit board (PCB) 40.

The display panel 10 includes a display area DA corresponding to a screen on which an image is displayed, and a non-display area NA in which circuits and/or signal lines for generating and/or transmitting signals (e.g., several signals) applied to the display area DA are disposed. The non-display area NA may surround the display area DA. In FIG. 1, the boundary between the display area DA and the non-display area NA is indicated by a dotted line quadrangle. However, the present disclosure is not limited thereto. For example, the non-display area NA indicated by the dotted line may be any suitable shape.

The pixels PX may be disposed in a matrix form in the display area DA of the display panel 10. In the display area DA, signal lines such as a first scan line 121, a second scan line 122, a data line 171, a driving voltage line 172, a common voltage line 173, an initializing voltage line 174, and/or the like may be disposed. The first scan line 121 and the second scan line 122 may extend approximately or substantially in the first direction x. The data line 171, the driving voltage line 172, the common voltage line 173, and the initializing voltage line 174 may extend approximately or substantially in the second direction y. At least one of the driving voltage line 172, the common voltage line 173, or the initializing voltage line 174 includes a voltage line extending approximately or substantially in the first direction x and a voltage line extending approximately or substantially in the second direction y, thereby being disposed in a form of a mesh. The first scan line 121, the second scan line 122, the data line 171, the driving voltage line 172, the common voltage line 173, the initializing voltage line 174, and the like are connected to each pixel PX, and each pixel PX may receive the first scan signal, the second scan signal, the data voltage, the driving voltage, the common voltage, the driving voltage, and the like from these signal lines. The pixel PX may be implemented as a light-emitting element such as a light emitting diode (LED). In one or more embodiments, each of the pixels PX may be implemented as a light-emitting element such as a LED.

In the display area DA of the display panel 10, a touch sensor for sensing a contact touch and/or a non-contact touch (e.g., a finger, a stylus, and/or the like hovering in close proximity to the touch sensor) of a user may be disposed.

A pad portion PP may be disposed in the non-display area NA of the display panel 10, and pads for receiving signals from the outside of the display panel 10 are disposed in the pad portion PP. In one or more embodiments, the flexible printed circuit film 20 may be bonded to the pad portion PP. The pads of the flexible printed circuit film 20 may be connected (e.g., electrically connected) to the pads of the pad portion PP. The display panel 10 may include two or more pad portions PP, and the pad portions PP may be disposed apart from or spaced from each other along one edge of the display panel 10. The corresponding flexible printed circuit film 20 may be bonded to each pad portion PP. The display panel 10 may include one pad portion PP depending on the size, and one flexible printed circuit film 20 may be bonded thereto.

A driving unit for generating and/or processing the signals (e.g., several signals) to drive the display panel 10 may be disposed in the non-display area NA of the display panel 10. The driving unit may include a data driver applying a data signal to the data line 171, a gate driver applying a gate signal to the first scan line 121 and the second scan line 122, and a signal controller controlling the gate driver and the data driver. The pixels PX may receive the data voltage or the initializing voltage at a set timing (e.g., a predetermined timing) depending on the scan signal generated in the gate driver. The gate driver may be integrated on the display panel 10 and may be disposed on at least one side of the display area DA.

The data driver may be provided as an integrated circuit chip 30, and the integrated circuit chip 30 may be mounted on the flexible printed circuit film 20. The signals output from the integrated circuit chip 30 may be transmitted to the display panel 10 through the pad portion of the flexible printed circuit film 20 and the pad portion of the display panel 10. The integrated circuit chip 30 may be mounted on the non-display area NA of the display panel 10 and may be disposed between the display area DA and the pad portion PP. The display device may include a plurality of integrated circuit chips 30, and the number of integrated circuit chips 30 may increase as the size of the display panel 10 increases. The signal controller may be provided as an integrated circuit chip and may be mounted on the printed circuit board (PCB) 40. The data driver and the signal controller may each be provided as an integrated chip. The flexible printed circuit films 20 may be bonded to the printed circuit board (PCB) 40 to be connected (e.g., electrically connected) thereto to transmit signals between the display panel 10 and the printed circuit board (PCB) 40.

The integrated circuit chip 30 may output signals provided to the display area DA. For example, the integrated circuit chip 30 may output the data voltage, the driving voltage, the common voltage, the initializing voltage, and the like. A data voltage transmitting line, a driving voltage transmitting line, a common voltage transmitting line, and an initializing voltage transmitting line may be disposed in the non-display area NA to transmit the data voltage, the driving voltage, the common voltage, and the initializing voltage, which are output from the integrated circuit chip 30, to the data line 171, the driving voltage line 172, the common voltage line 173, and the initializing voltage line 174 of the display area DA. The integrated circuit chip 30 may also output the signals for controlling the gate driver to the non-display area DA, and the lines transmitting these signals may be connected thereto.

Figure 2:
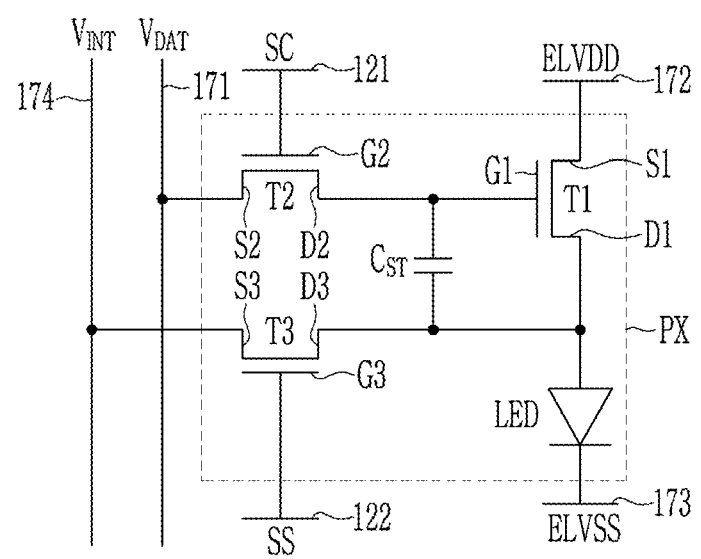
FIG. 2 is a circuit diagram of a pixel of a display device according to an embodiment.

FIG. 2 is a circuit diagram of a pixel PX of a display device according to an embodiment.

The pixel PX may include transistors T1, T2, and T3, a storage capacitor $C_{ST}$, and an LED.

The transistors T1, T2, and T3 include a first transistor T1, a second transistor T2, and a third transistor T3. The transistors T1, T2, and T3 may be N-type transistors as shown in FIG. 2. However, the present disclosure is not limited thereto. For example, the transistors T1, T2, and T3 may be P-type transistors, and may also include N-type transistors and P-type transistors with suitable changes to the circuit.

The first transistor T1 includes a gate electrode G1 (referred to as a control electrode) connected to the first electrode of the storage capacitor $C_{ST}$ and the drain electrode D2 of the second transistor T2, a source electrode S1 (referred to as a first electrode or an input electrode) connected to the driving voltage line 172, and a drain electrode D1 (referred to as a second electrode or an output electrode) connected to the pixel electrode of the LED and the second electrode of the storage capacitor $C_{ST}$. The first transistor T1 may receive the data voltage $V_{DAT}$ depending on the switching operation of the second transistor T2 to supply the driving current to the LED depending on a voltage stored in the storage capacitor $C_{ST}$. The first transistor T1 may be a transistor outputting the driving current to the LED, and may be referred to as a driving transistor.

The second transistor T2 includes a gate electrode G2 connected to the first scan line 121, a source electrode S2 connected to the data line 171, and a drain electrode D2 connected to the first electrode of the storage capacitor $C_{ST}$ and the gate electrode G1 of the first transistor T1. The second transistor T2 is turned on depending on the first scan signal SC applied through the first scan line 121 such that the reference voltage or the data voltage $V_{DAT}$ may be transmitted to the gate electrode G1 of the first transistor T1 and the first electrode of the storage capacitor $C_{ST}$. The second transistor T2 may be referred to as a switching transistor.

The third transistor T3 includes a gate electrode G3 connected to the second scan line 122, a source electrode S3 connected to the initializing voltage line 174, and a drain electrode D3 connected to the second electrode of the storage capacitor $C_{ST}$ and the pixel electrode of the LED. The third transistor T3 is turned on depending on the second scan signal SS applied through the second scan line 122 to transmit the initializing voltage $V_{INT}$ to the pixel electrode of the LED and the second electrode of the storage capacitor $C_{ST}$, thereby initializing the voltage of the pixel electrode of the LED. The third transistor T3 may be referred to as an initializing transistor.

The storage capacitor $C_{ST}$ includes a first electrode connected to the gate electrode G1 of the first transistor T1 and a second electrode connected to the drain electrode D3 of the third transistor T3 and the pixel electrode of the LED.

The LED includes a pixel electrode connected to the drain electrode D1 of the first transistor T1 and a common electrode connected to the common voltage line 173. When the first transistor T1 is turned on, the driving current flows to the LED and the LED can emit light with a set luminance (e.g., a predetermined luminance).

The operation during one frame of the pixel PX shown in FIG. 1 is described in more detail as follows. The pixel PX may be operated (e.g., be driven) over approximately four periods (e.g., four periods) during one frame, that is, an initializing period, a sensing period, a data input period, and a light emitting period.

In the initializing period, a first scan signal SC of a high level and a second scan signal SS of a high level are supplied such that the second transistor T2 and the third transistor T3 are turned on. The reference voltage from the data line 171 is supplied to the gate electrode G1 of the first transistor T1 and the first electrode of the storage capacitor $C_{ST}$ through the turned-on second transistor T2, and the initializing voltage $V_{INT}$ is supplied to the drain electrode D1 of the first transistor T1 and the pixel electrode of the LED through the turned-on third transistor T3. Accordingly, during the initializing period, the drain electrode D1 of the first transistor T1 and the pixel electrode of the LED are initialized to the initializing voltage $V_{INT}$. At this time, the voltage corresponding to the difference between the reference voltage and the initializing voltage $V_{INT}$ is stored in the storage capacitor $C_{ST}$.

In the sensing period, if the second scan signal SS becomes low level in the state that the first scan signal SC of a high level is maintained, the second transistor T2 maintains the turned-on state and the third transistor T3 is turned off. The gate electrode G1 of the first transistor T1 and the first electrode of the storage capacitor $C_{ST}$ maintain the reference voltage through the turned-on second transistor T2, and the drain electrode D1 of the first transistor T1 and the pixel electrode of the LED are disconnected from the initializing voltage $V_{INT}$ through the turned-off third transistor T3. Accordingly, while the current flows from the source electrode S1 to the drain electrode D1, if the voltage of the drain electrode D1 becomes "the reference voltage— the threshold voltage of the first transistor T1", the first transistor T1 is turned off. At this time, a voltage difference between the gate electrode G1 and the drain electrode D1 of the first transistor T1 is stored in the storage capacitor $C_{ST}$, and the sensing of the threshold voltage of the first transistor T1 is completed. By generating the data voltage compensated by reflecting characteristic information sensed during the sensing period, a characteristic deviation of the first transistor T1, which may be different for each pixel PX, may be compensated externally.

In the data input period, if the first scan signal SC of a high level is supplied and the second scan signal SS of a low level is supplied, the second transistor T2 is turned on and the third transistor T3 is turned off. The data voltage $V_{DAT}$ from the data line 171 is supplied to the gate electrode G1 of the first transistor T1 and the first electrode of the storage capacitor $C_{ST}$ through the turned-on second transistor T2. At this time, the drain electrode D1 of the first transistor T1 and the common electrode of the LED may maintain almost the potential in the sensing period as it is by the first transistor T1 in the turned-off state.

In the light emission period, the first transistor T1 that is turned on by the data voltage $V_{DAT}$ transmitted to the gate electrode G1 generates the driving current depending on the data voltage $V_{DAT}$, and the LED may be emitted with a set luminance (e.g., a predetermined luminance) based on the driving current.

Figure 3:
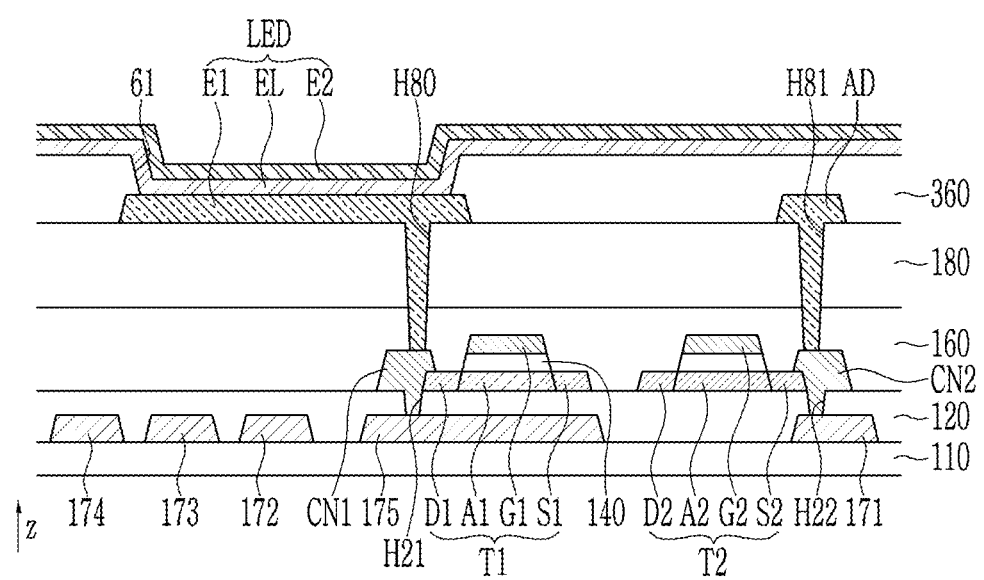
FIG. 3 is a schematic cross-sectional view of a display device according to an embodiment.

FIG. 3 is a schematic cross-sectional view of a display device according to an embodiment. FIG. 3 schematically shows a part among constituent elements of the pixel circuit shown in FIG. 2 in the region corresponding to approximately one pixel region among the display area DA of the display panel 10 shown in FIG. 1.

Referring to FIG. 3, the display panel 10 of the display device includes a substrate 110 and layers, elements, and wirings thereon. The substrate 110 may include an insulating material such as glass, plastic, and/or the like.

A first conductor including a data line 171 and a light blocking layer 175 may be disposed on the substrate 110. For example, the data line 171 and the light blocking layer 175 may be at a same layer on the substrate 110.

The light blocking layer 175 blocks or substantially blocks external light from reaching the semiconductor layer of the transistors, thereby preventing or reducing characteristic deterioration of the semiconductor layer. The light blocking layer 175 may control the leakage current of the first transistor T1 in which the current characteristic is important, particularly in an emissive display device. The light blocking layer 175 may function as an electrode that receives a specific voltage in the display panel 10. In this case, a change rate of the current in a saturated region of a voltage-current characteristic graph of the first transistor T1 may be reduced to improve the characteristic as the driving transistor.

The first conductor may further include a driving voltage line 172, a common voltage line 173, and/or an initializing voltage line 174. The data line 171, the driving voltage line 172, the common voltage line 173, and/or the initializing voltage line 174 may overlap the semiconductor of the transistor, thereby functioning like the light blocking layer 175.

Components of the first conductor may be formed of the same material in the same process. The first conductor may be formed by forming a conductive material layer on the substrate 110 and patterning it by using one photomask. Because the first conductor includes the data line 171 in addition to the light blocking layer 175, a separate photomask used to form the data line 171 and the like may be eliminated. Therefore, the number of photomasks used to manufacture the display device may be reduced. The first conductor may include a metal such as copper (Cu), aluminum (Al), silver (Ag), chromium (Cr), titanium (Ti), and tantalum (Ta), or one or more alloys thereof. For example, the first conductor may be a multi-layer structure such as titanium (Ti)/copper (Cu) or titanium (Ti)/copper (Cu)/titanium (Ti)/copper (Cu). However, the present disclosure is not limited thereto.

A first insulating layer 120 may be disposed on the first conductor. The first insulating layer 120 may block an impurity that may diffuse from the substrate 110 to the semiconductor layer in a process of forming the semiconductor layer and reduce stress that the substrate 110 receives. The first insulating layer 120 may be referred to as a buffer layer. The first insulating layer 120 may include inorganic insulating materials such as a silicon nitride (SiNx) and/or a silicon oxide (SiOx).

The semiconductor layer of the transistors may be disposed on the first insulating layer 120. The semiconductor layer may include a channel region A1 of the first transistor T1 and a channel region A2 of the second transistor T2. The source electrode S1 and the drain electrode D1 on respective sides of the channel region A1 of the first transistor T1 and the source electrode S2 and the drain electrode D2 on respective sides of the channel region A2 of the second transistor T2 may be regions in which the semiconductor layer is a conductor. The channel region A1 of the first transistor T1 may overlap the light blocking layer 175. The semiconductor layer may further include a channel region of the third transistor T3.

The semiconductor layer may be formed by forming a semiconductor material layer on the first insulating layer 120 and patterning it by using one photomask. The semiconductor layer may include an oxide semiconductor, polysilicon, or amorphous silicon. The oxide semiconductor may include an oxide of a metal such as zinc (Zn), indium (In), gallium (Ga), tin (Sn), titanium (Ti), and/or the like, or a combination of the metal and an oxide thereof such as zinc (Zn), indium (In), gallium (Ga), tin (Sn), titanium (Ti), and/or the like. The oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

A second insulating layer 140 overlapping the channel regions A1 and A2 may be disposed on the semiconductor layer. The second insulating layer 140 may be referred to as a gate insulating layer. The second insulating layer 140 may include inorganic insulating materials such as a silicon oxide and/or a silicon nitride.

A second conductor including a gate electrode G1 of the first transistor T1, a gate electrode G2 of the second transistor T2, a connecting member CN1, and a connecting member CN2 may be disposed on the semiconductor layer and the second insulating layer 140.

The gate electrode G1 of the first transistor T1 may overlap the channel region A1, and the gate electrode G2 of the second transistor T2 may overlap the channel region A2. The gate electrode G1 of the first transistor T1 may extend to be connected to the drain electrode D2 of the second transistor T2. The connecting member CN1 in contact with the drain electrode D1 of the first transistor T1 is connected to the light blocking layer 175 through a contact hole H21 formed in the first insulating layer 120, thereby electrically connecting the drain electrode D1 and the light blocking layer 175. The connecting member CN2 in contact with the source electrode S2 of the second transistor T2 is connected to the data line 171 through a contact hole H22 formed in the first insulating layer 120, thereby electrically connecting the source electrode S2 and the data line 171.

In one or more embodiments, the second conductor may further include a gate electrode G3 of the third transistor T3. The second conductor may further include a connecting member electrically connecting the source electrode S1 of the first transistor T1 and the driving voltage line 172, a connecting member electrically connecting the source electrode S3 of the third transistor T3 and the initializing voltage line 174, and a connecting member connected to the common voltage line 173. The second conductor may further include a first scan line 121, a second scan line 122, and one electrode of the storage capacitor $C_{ST}$. The gate electrode G2 of the second transistor T2 may be connected to the first scan line 121 or a part of the first scan line 121.

The second conductor may include at least one among a driving voltage line 172, a common voltage line 173, and an initializing voltage line 174.

Components of the second conductor may be formed from the same material in the same process. The second conductor may be formed by forming a conductive material layer on the substrate 110 on which the second insulating layer 140 is formed, and patterning it by using a single photomask. The second conductor may include a metal such as copper (Cu), aluminum (Al), silver (Ag), chromium (Cr), titanium (Ti), tantalum (Ta), the like, or alloys thereof. For example, the second conductor may be a multi-layer structure, such as titanium (Ti)/copper (Cu) or titanium (Ti)/copper (Cu)/titanium (Ti)/copper (Cu). However, the present disclosure is not limited thereto.

Contact holes H21 and H22 of the first insulating layer 120 and the second insulating layer 140 may be formed by forming an insulating material layer on the first insulating layer 120 and the semiconductor layer and patterning it by using one photomask. For example, the insulating material layer may be formed and patterned on the semiconductor layer to form a second insulating layer 140 and to form contact holes H21 and H22 in the first insulating layer 120 using one photomask.

A third insulating layer 160 may be disposed on the second conductor. The third insulating layer 160 may include an inorganic insulating material such as a silicon oxide and/or a silicon nitride. The third insulating layer 160 may be referred to as a passivation layer.

A fourth insulating layer 180 may be disposed on the third insulating layer 160. The fourth insulating layer 180 may include organic insulating materials such as an acryl-based polymer, a siloxane-based polymer, and/or an imide-based polymer. The fourth insulating layer 180 may be referred to as a planarization layer.

A third conductor including a pixel electrode E1 of the LED and an auxiliary data pattern AD may be disposed on the fourth insulating layer 180. The pixel electrode E1 may be connected to the connecting member CN1 through a contact hole H80 formed in the fourth insulating layer 180 and the third insulating layer 160. Because the connecting member CN1 is connected to the drain electrode D1 of the first transistor T1, the pixel electrode E1 may be connected (e.g., electrically connected) to the drain electrode D1. The auxiliary data pattern AD may be connected to the connecting member CN2 through a contact hole H81 formed in the fourth insulating layer 180 and the third insulating layer 160. Because the connecting member CN2 is connected to the data line 171, the auxiliary data pattern AD may be connected (e.g., electrically connected) to the data line 171.

Figure 4:
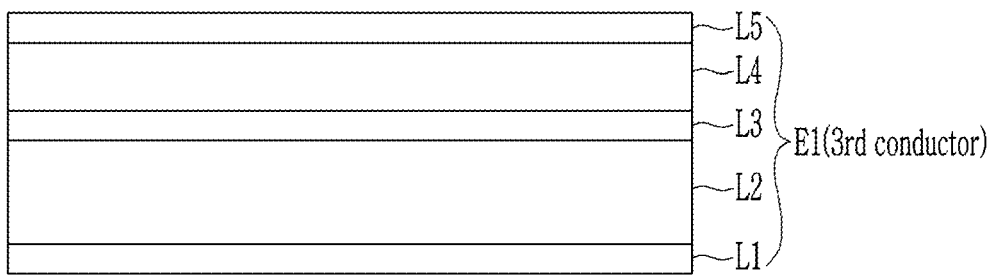
FIG. 4 is a cross-sectional view of a first electrode of a light emitting diode (LED) in a display device according to an embodiment.

The third conductor including the pixel electrode E1 and the auxiliary data pattern AD may be a multi-layer structure, and a detailed structure is explained with reference to FIG. 4. FIG. 4 is a cross-sectional view of a pixel electrode E1 of an LED in a display device according to an embodiment.

Referring to FIG. 4, the third conductor including the pixel electrode E1 may have a structure (e.g., a multi-layer structure) in which a first layer L1, a second layer L2, a third layer L3, a fourth layer L4, and a fifth layer L5 are stacked (e.g., sequentially stacked).

The first layer L1 may increase an adhesion of the pixel electrode E1 to the fourth insulating layer 180. The first layer L1 may also be a lower barrier layer that prevents or substantially prevents the lower surface of the second layer L2 from being corroded. The first layer L1 may include a material having stronger corrosion resistance than the second layer L2. The first layer L1 may include a metal such as titanium (Ti), molybdenum (Mo), and/or the like, or one or more alloys thereof.

The second layer L2 positioned above the first layer L1 may include a metal having small resistivity such as copper (Cu). In a case where the second layer L2 includes copper (Cu), the first layer L1 may include a material having an excellent adhesion characteristic with the fourth insulating layer 180 and the second layer L2. For example, the first layer L1 may include a copper alloy such as a copper (Cu)-manganese (Mg)-aluminum (Al) alloy and/or a copper (Cu)-calcium (Ca) alloy. In order to reduce the resistance of the pixel electrode E1, the second layer L2 may be formed to be relatively thick. The second layer L2 may have a thickness of about 3000 Angstroms (Å) or more.

The third layer L3 positioned on the second layer L2 may be an upper barrier layer that covers the upper surface of the second layer L2 and prevents or substantially prevents the upper surface of the second layer L2 from being corroded. The third layer L3 may include a material having stronger corrosion resistance than the second layer L2. The third layer L3 may include metals such as titanium (Ti) and/or molybdenum (Mo), or one or more alloys thereof.

The fourth layer L4 positioned on the third layer L3 may reflect light emitted from the emission layer (EL) of the LED to increase light emission efficiency. The fourth layer L4 may include a metal such as silver (Ag) or an alloy thereof (e.g., a silver (Ag)-indium (In) alloy) having low resistivity and excellent reflectivity.

The fifth layer L5 positioned on the fourth layer L4 may prevent or substantially prevent the upper surface of the fourth layer L4 from being corroded. The fifth layer L5 may include a material having stronger corrosion resistance than the fourth layer L4. The fifth layer L5 may include transparent conductive oxides such as indium tin oxide (ITO) and/or indium zinc oxide (IZO). The fifth layer L5 may be an uppermost layer of the pixel electrode E1.

As described above, the data line 171 and the like are formed as a first conductor positioned between the substrate 110 and the first insulating layer 120 such as the light blocking layer 175. It is advantageous to increase the thickness of the first conductor in order to reduce the resistance of the data line 171 and the like to reduce an RC delay. However, when the thickness of the first conductor is increased, a step of the insulating layer such as the first insulating layer 120 formed on the first conductor increases and a step coverage of the insulating layer may become bad causing defects such as a cracking occurrence or adhesion deterioration in the insulating layer, the semiconductor layer, and/or the conductor may occur. In one or more embodiments, when the third conductor including the pixel electrode E1 and the auxiliary data pattern AD is formed to include the metal layer containing a low-resistance metal such as copper (Cu), the resistance of the wiring in the display device may be reduced. For example, because the auxiliary data pattern AD is connected (e.g., electrically connected) to the data line 171, the resistance of the data line 171 may be reduced. Therefore, even if the first conductor is formed to a set thickness (e.g., a predetermined thickness) so that a problem due to the step does not occur, the first conductor may be designed to satisfy the resistance characteristic desired for the display device. In other words, in one or more embodiments of the present disclosure, the desired resistance characteristic for the display device may be satisfied without increasing the thickness of the first conductor to a thickness that may cause defects.

The third conductor may further include another electrode of the storage capacitor $C_{ST}$.

Components of the third conductor may be formed of the same material in the same process. The third conductor, on the fourth insulating layer 180, may be formed by forming (e.g., sequentially forming) a first conductive material layer, a second conductive material layer, a third conductive material layer, a fourth conductive material layer, and a fifth conductive material layer and patterning them by using one photomask.

Again referring to FIG. 3, a fifth insulating layer 360 may be disposed on the fourth insulating layer 180 and the third conductor. The fifth insulating layer 360 may have an opening 61 overlapping the pixel electrode E1. The opening 61 of the fifth insulating layer 360 may define each pixel area, and may be referred to as a pixel definition layer or a partition. The fifth insulating layer 360 may include organic insulating materials such as acryl-based polymers and/or imide-based polymers. The fifth insulating layer 360 may include a black pigment or dye. In this case, the black pigment or dye of the fifth insulating layer 360 may improve the contrast ratio and prevent or substantially prevent the reflection of the metal layer positioned below the fifth insulating layer 360 from being viewed.

An emission layer EL may be disposed on the pixel electrode E1. The emission layer EL may be disposed within the opening 61 of the fifth insulating layer 360. The emission layer EL may also be disposed on the fifth insulating layer 360. In addition to the emission layer EL, at least one of a hole injection layer, a hole transport layer, an electron transport layer, or an electron injection layer may be disposed on the pixel electrode E1.

A common electrode E2 may be disposed on the emission layer EL. The common electrode E2 may be disposed across several pixels PX. The common electrode E2 may be connected to a connecting member that is directly or indirectly connected to the common voltage line 173, thereby being electrically connected to the common voltage line 173. In the emission layer EL and the fifth insulating layer 360, a contact hole for connecting the common electrode E2 to the connecting member may be formed by laser drilling. The common electrode E2 may be formed thinly of a metal or a metal alloy having a low work function such as calcium (Ca), barium (Ba), magnesium (Mg), aluminum (Al), silver (Ag), and/or the like to have a light transmitting property. The common electrode may include a transparent conductive oxide such as indium tin oxide (ITO) and/or indium zinc oxide (IZO).

The pixel electrode E1, the emission layer EL, and the common electrode E2 of each pixel PX form the LED such as an organic light emitting diode. The pixel electrode E1 may be an anode of the light emitting diode (LED), and the common electrode E2 may be a cathode of the light emitting diode (LED). The LED may emit blue light. The LED may emit light of one of three primary colors (e.g., a red color, a green color, or a blue color) or emit white light.

An encapsulation layer may be disposed on the common electrode E2. The encapsulation layer may be a glass substrate combined with the substrate 110 by a sealant. The encapsulation layer may be a thin film encapsulation layer in which at least one inorganic layer and at least one organic layer are stacked.

One example of a method for manufacturing the display device shown in FIG. 3 is described in more detail below with reference to FIGS. 5-9.

FIGS. 5-9 are cross-sectional views showing a method of manufacturing the display device shown in FIG. 3.

Figure 5:
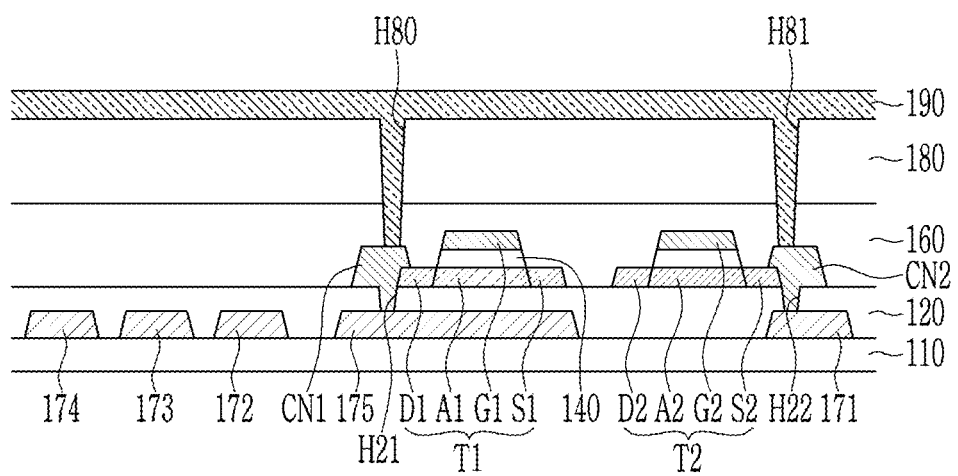
FIG. 5-9 are cross-sectional views showing a method of manufacturing the display device shown in FIG. 3.

Referring to FIG. 5, a conductive material layer may be formed on a substrate 110 and patterned to form a first conductor including a data line 171, a driving voltage line 172, a common voltage line 173, an initializing voltage line 174, and a light blocking layer 175.

A first insulating layer 120 may be formed on the first conductor. A semiconductor material layer may be formed on the first insulating layer 120 and patterned to form a semiconductor layer including a channel region A1 of a first transistor T1, a channel region A2 of a second transistor T2, and a channel region of a third transistor T3. The semiconductor layer may further include source regions and drain regions on respective sides of each channel region of the transistors T1, T2, and T3.

An insulating material layer may be formed and patterned on the semiconductor layer to form a second insulating layer 140 and to form contact holes H21 and H22 in the first insulating layer 120. That is, the second insulating layer 140 and the contact holes H21 and H22 may be formed by using one photomask. The source regions and the drain regions of the transistors T1, T2, and T3 that are not covered by the second insulating layer 140 may be conductors to be source electrodes S1, S2, and S3 and drain electrodes D1, D2, and D3. The source regions and the drain regions may be made conductive by diffusion or doping of hydrogen (H) etc. during a heat treatment for activation of the channel regions, formation of the third insulating layer 160, and/or a separate plasma treatment or heat treatment.

A conductive material layer may be formed and patterned on the substrate 110 including the second insulating layer 140 to form a second conductor including gate electrodes G1, G2, and G3 of the transistors T1, T2, and T3 and connecting members CN1 and CN2.

A third insulating layer 160 may be formed on the second conductor, and a fourth insulating layer 180 may be formed on the third insulating layer 160. The fourth insulating layer 180 may be patterned to form a contact hole H80.

A conductive material layer 190 may be formed and patterned on the fourth insulating layer 180 to form a third conductor including a pixel electrode E1 and an auxiliary data pattern AD. The third conductor, as shown in FIG. 4, may include a first layer L1, a second layer L2, a third layer L3, a fourth layer L4, and a fifth layer L5. The third conductor having the multi-layer structure may be formed by forming (e.g., sequentially forming) a first conductive material layer containing (e.g., being) titanium (Ti), a second conductive material layer containing (e.g., being) copper (Cu), a third conductive material layer containing (e.g., being) titanium (Ti), a fourth conductive material layer containing (e.g., being) indium tin oxide (ITO), and a fifth conductive material layer containing (e.g., being) silver (Ag) over the fourth insulating layer 180 and then patterning them.

The formation process of the third conductor is explained in more detail below with reference to FIGS. 6-9.

Figure 6:
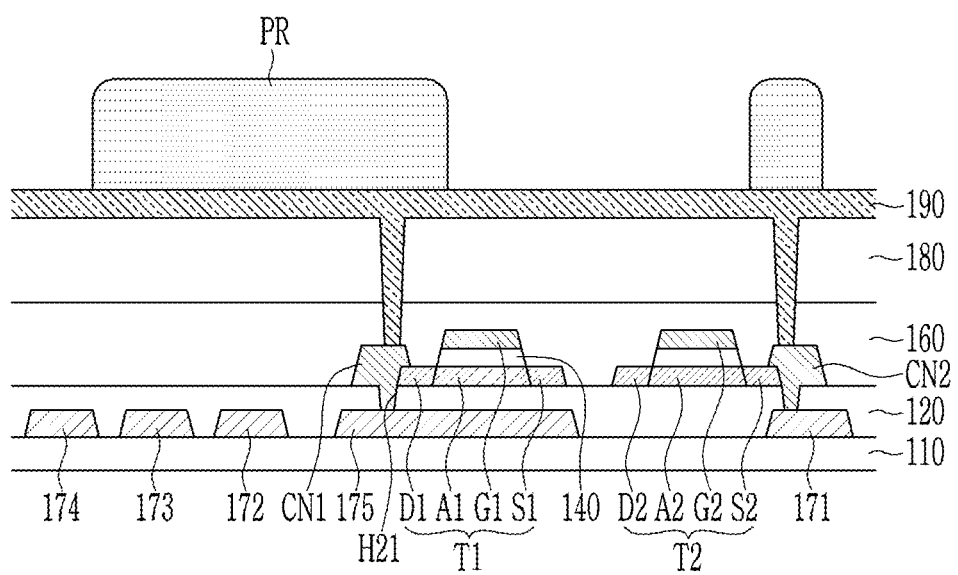

Referring to FIG. 6, the conductive material layer 190 including the first to fifth conductive material layers (i.e., the first conductive material layer, the second conductive material layer, the third conductive material layer, the fourth conductive material layer, and the fifth conductive material layer) is formed on the fourth insulating layer 180. In this case, the conductive material layer 190 may be connected to the drain electrode D1 of the first transistor T1 and the connecting member CN1 through the contact holes H80 and H82 of the fourth insulating layer 180 and the third insulating layer 160. A photoresist is coated on the conductive material layer 190 and patterned by a photolithography process using a photomask to form a photosensitive film pattern PR. The photosensitive film pattern PR may overlap the third conductor.

Figure 7:
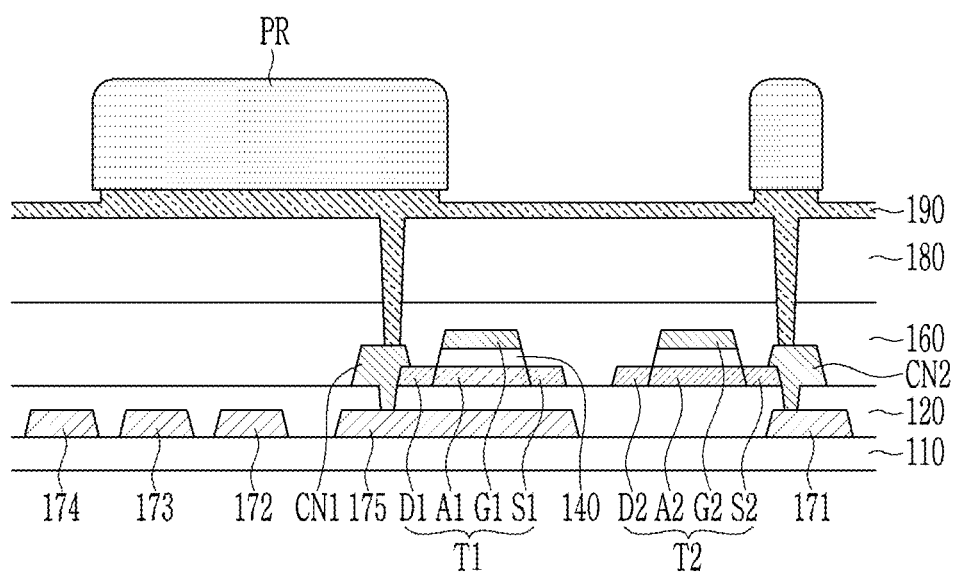

Referring to FIG. 7, the fifth conductive material layer and the fourth conductive material layer are wet-etched firstly by using the photosensitive film pattern PR as a mask. A phosphoric-acetic-nitric acid etchant may be used in the first wet etching. By the first wet etching, the fifth conductive material layer including silver (Ag) and the fourth conductive material layer including indium tin oxide (ITO) are etched, and the first to third conductive material layers (i.e., the first conductive material layer, the second conductive material layer, and the third conductive material layer) remain without being etched (i.e., unetched). Accordingly, in the conductive material layer 190, the first to fifth conductive material layers exist (e.g., are present) in the region overlapping the photosensitive film pattern PR, and the first to third conductive material layers exist (e.g., are present) in the region not overlapping (i.e., exposed by) the photosensitive film pattern PR. During the first wet etching, the second conductive material layer is protected from the etching solution by the third conductive material layer, so that the second conductive material layer is not damaged or etched.

Figure 8:
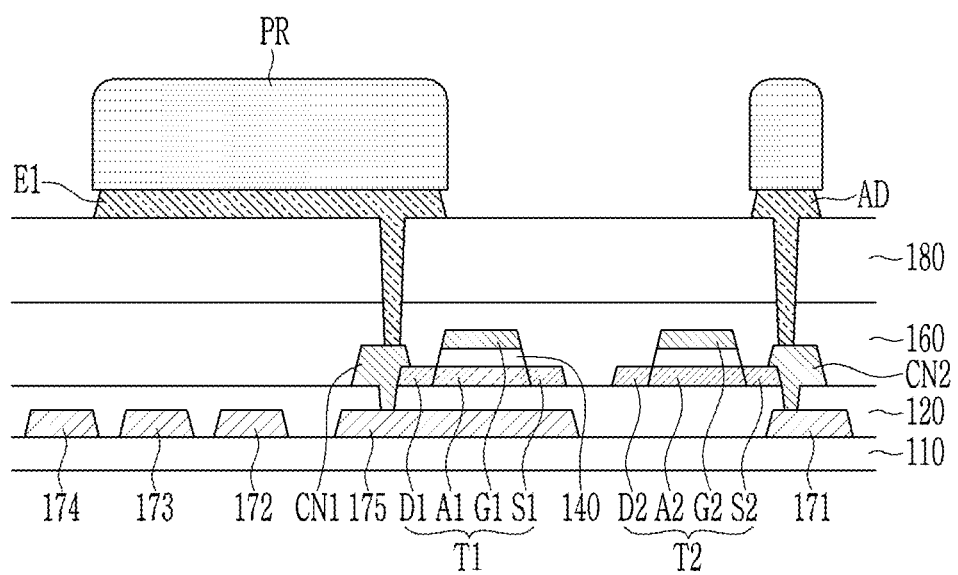

Referring to FIG. 8, the third conductive material layer, the second conductive material layer and the first conductive material layer are secondarily wet etched by using the photosensitive film pattern PR as a mask. In the secondary wet etching, a non-hydrogen peroxide etchant containing nitric acid and hydrofluoric acid may be used. By the secondary wet etching, the third conductive material layer containing titanium (Ti), the second conductive material layer containing copper (Cu), and the first conductive material layer containing titanium (Ti) are etched. Accordingly, in the conductive material layer 190, the first to fifth conductive material layers are present in the region overlapping the photosensitive film pattern PR and the first to fifth conductive material layers are removed in the region not overlapping (i.e., exposed by) the photosensitive film pattern PR, so that the third conductor containing including the pixel electrode E1 and the auxiliary data pattern AD is formed.

Figure 9:
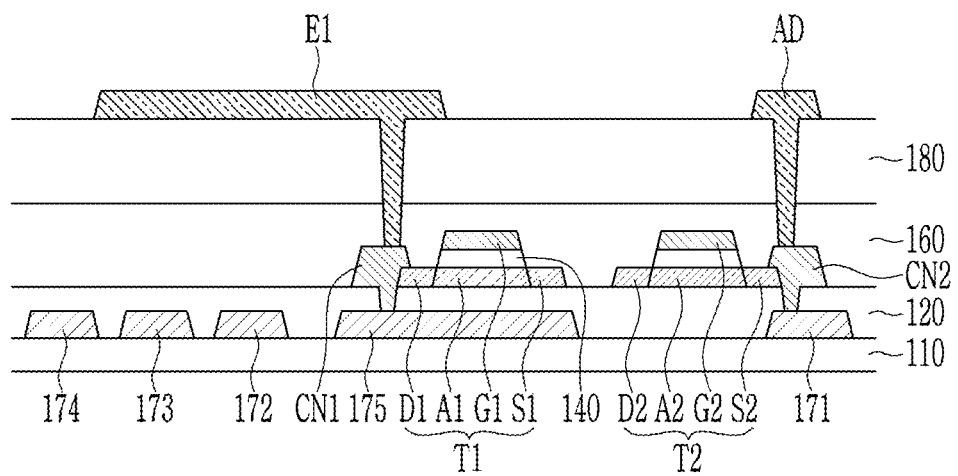

Referring to FIG. 9, the photosensitive film pattern PR disposed on the third conductor is removed by a strip process.

As above, the third conductor including the first to fifth layers L1 to L5 (i.e., the first layer L1, the second layer L2, the third layer L3, the fourth layer L4, and the fifth layer L5) may be formed through the primary and secondary wet etchings, but the third conductor may be formed using a single photomask.

After forming the third conductor, again referring to FIG. 3, an insulating material layer is formed and patterned on the third conductor to form a fifth insulating layer having an opening 61 overlapping the pixel electrode E1. Subsequently, an emission layer EL and a common electrode E2 are formed (e.g., sequentially formed), thereby manufacturing a display device having a cross-sectional structure as shown in FIG. 3. When manufacturing such a display device, seven photomasks may be used, and one photomask may be eliminated compared to a display device including a conductor between the fourth insulating layer 180 and the fifth insulating layer 360.

Figure 10:
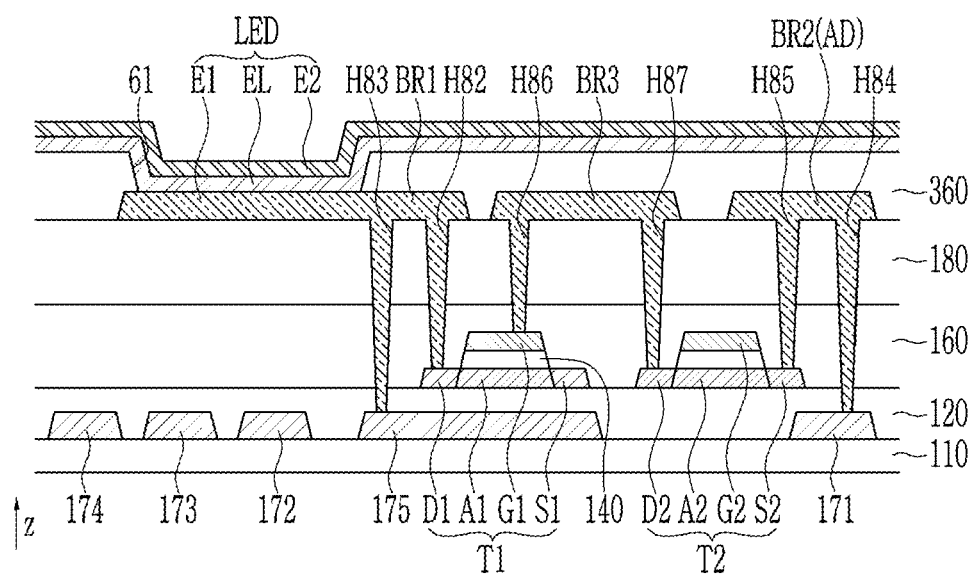
FIG. 10 is a schematic cross-sectional view of a display device according to an embodiment.

FIG. 10 is a schematic cross-sectional view of a display device according to an embodiment.

FIG. 10, like FIG. 3, schematically shows a part of the constituent elements of the pixel circuit shown in FIG. 2 in the region corresponding to approximately one pixel region in the display area DA of the display panel 10 shown in FIG. 1. The embodiment of FIG. 10 has differences from the embodiment in the stacked structure, and the following description may describe the differences.

Referring to FIG. 10, a first conductor including a data line 171 and a light blocking layer 175 may be disposed on a substrate 110. The first conductor may further include a driving voltage line 172, a common voltage line 173, and/or an initializing voltage line 174.

A first insulating layer 120, which is an insulating layer, may be disposed on the first conductor. A semiconductor layer of the transistors may be disposed on the first insulating layer 120. The semiconductor layer may include the channel region A1 of the first transistor T1, the channel region A2 of the second transistor T2, and the channel region of the third transistor T3.

A second insulating layer 140 overlapping the channel regions A1 and A2 may be disposed on the semiconductor layer. A second conductor including the gate electrode G1 of the first transistor T1 and a gate electrode G2 of the second transistor T2 may be disposed on the semiconductor layer and the second insulating layer 140. The second conductor may further include a gate electrode G3 of the third transistor T3. The second conductor may further include a first scan line 121, a second scan line 122, and one electrode of the storage capacitor $C_{ST}$. The second conductor may include at least one of a driving voltage line 172, a common voltage line 173, or an initializing voltage line 174.

A third insulating layer 160 may be disposed on the second conductor. A fourth insulating layer 180 may be disposed on the third insulating layer 160.

A third conductor including a pixel electrode E1 of the LED, a first bridge BR1, a second bridge BR2, and a third bridge BR3 may be disposed on the fourth insulating layer 180.

The first bridge BR1 is connected to the drain electrode D1 of the first transistor T1 through the contact hole H82 formed in the fourth insulating layer 180 and the third insulating layer 160 and is connected to the light blocking layer 175 through the contact hole H83 formed in the fourth insulating layer 180, the third insulating layer 160, and the first insulating layer 120, thereby electrically connecting the light blocking layer 175 and the drain electrode D1.

The second bridge BR2 is connected to the data line 171 through the contact hole H84 formed in the fourth insulating layer 180, the third insulating layer 160, and the first insulating layer 120 and is connected to the source electrode S2 of the second transistor T2 through the contact hole H85 formed in the fourth insulating layer 180 and the third insulating layer 160, thereby electrically connecting the source electrode S2 and the data line 171. Because the second bridge BR2 is connected to the data line 171, the resistance of the data line 171 may be reduced. Therefore, the second bridge BR2 may be an auxiliary data pattern AD that reduces the resistance of the data line 171. The auxiliary data pattern AD may further include a portion extending from the second bridge BR2.

The third bridge BR3 is connected to the gate electrode G1 of the first transistor T1 through the contact hole H86 formed in the fourth insulating layer 180 and the third insulating layer 160 and is connected to the drain electrode D2 of the second transistor T2 through the contact hole H87 formed in the fourth insulating layer 180 and the third insulating layer 160, thereby electrically connecting the gate electrode G1 and the drain electrode D2.

The pixel electrode E1 may be connected to the first bridge BR1. Because the first bridge BR1 is connected to the drain electrode D1 of the first transistor T1, the pixel electrode E1 may be connected (e.g., electrically connected) to the drain electrode D1. The pixel electrode E1 may be connected to the light blocking layer 175 through the contact hole H83, and may be connected to the drain electrode D1 of the first transistor T1 through the contact hole H82.

Like the embodiment of FIG. 3, the third conductor may have multiple layers. The specific configuration of the third conductor is as described above with reference to FIG. 4. By the third conductor as shown in FIG. 4, in the display device, the resistance of the wiring, for example, the data line 171, may be reduced, even if the first conductor is formed to a set thickness (e.g., a predetermined thickness) so that there is no problem caused by the step, so the first conductor may be designed to satisfy the resistance characteristic desired for the display device.

The third conductor may further include the bridge electrically connecting the source electrode S1 of the first transistor T1 and the driving voltage line 172, the bridge electrically connecting the source electrode S3 of the third transistor T3 and the initializing voltage line 174, the connecting member connected to the common voltage line 173, and/or the like. The third conductor may further include another electrode of the storage capacitor $C_{ST}$.

A fifth insulating layer 360 capable of having an opening 61 overlapping the pixel electrode E1 may be disposed on the fourth insulating layer 180 and the third conductor. An emission layer EL may be disposed on the pixel electrode E1. A common electrode E2 may be disposed on the emission layer EL. An encapsulation layer may be disposed on the common electrode E2.

FIGS. 11-15 are cross-sectional views showing a method of manufacturing the display device shown in FIG. 10.

Figure 11:
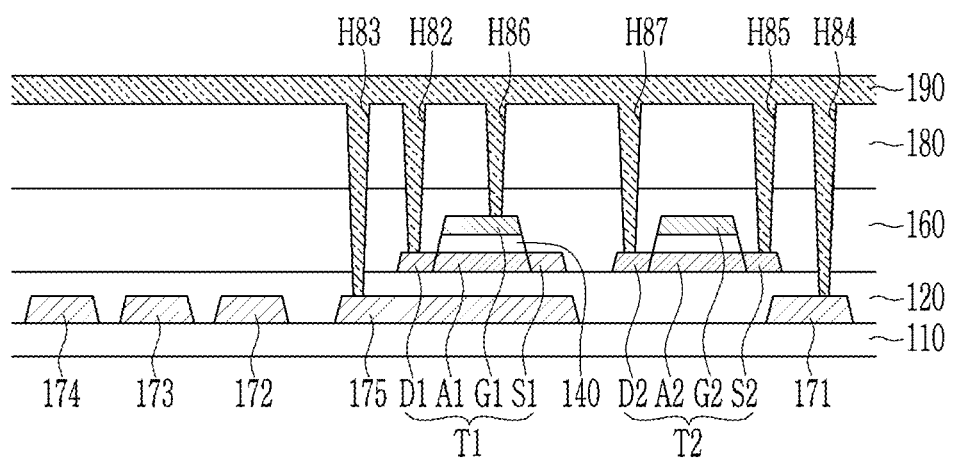
FIG. 11-15 are cross-sectional views showing a method of manufacturing the display device shown in FIG. 10.

Referring to FIG. 11, a conductive material layer may be formed on a substrate 110 and patterned to form a first conductor capable of including a data line, a driving voltage line 172, a common voltage line 173, an initializing voltage line 174, and a light blocking layer 175.

A first insulating layer 120 may be formed on the first conductor. A semiconductor material layer is formed on the first insulating layer 120 and patterned to form a semiconductor layer capable of including a channel region A1 of the first transistor T1, a channel region A2 of the second transistor T2, and a channel region of the third transistor T3. The semiconductor layer may further include source regions and drain regions on respective sides of each channel region of the transistors T1, T2, and T3.

An insulating material layer may be formed on the semiconductor layer and a conductive material layer may be formed on the insulating material layer and be patterned to form a second conductor capable of including gate electrodes G1, G2, and G3 of the transistors T1, T2, and T3, and a second insulating layer 140 may be formed. That is, the second conductor and the second insulating layer 140 may be formed using one photomask. The source regions and the drain regions of the transistors T1, T2, and T3 which are not covered by the second insulating layer 140 may be made conductive to be source electrodes S1, S2, and S3 and drain electrodes D1, D2, and D3.

A third insulating layer 160 may be formed on the second conductor, and a fourth insulating layer 180 may be formed on the third insulating layer 160. The fourth insulating layer 180 is patterned to form contact holes H82, H83, H84, H85, H86, and H87.

A conductive material layer 190 may be formed on the fourth insulating layer 180 and patterned to form a third conductor capable of including a pixel electrode E1, a first bridge BR1, a second bridge BR2, and a third bridge BR3. The third conductor, as shown in FIG. 4, may include the first layer L1, the second layer L2, the third layer L3, the fourth layer L4, and the fifth layer L5. The third conductor having the multi-layer structure may be formed by forming (e.g., sequentially forming) a first conductive material layer containing titanium (Ti), a second conductive material layer containing copper (Cu), a third conductive material layer containing titanium (Ti), a fourth conductive material layer including indium tin oxide (ITO), and a fifth conductive material layer containing silver (Ag) over the fourth insulating layer 180 and then patterning them.

The formation process of the third conductor is described in more detail below with reference to FIGS. 12-15.

Figure 12:
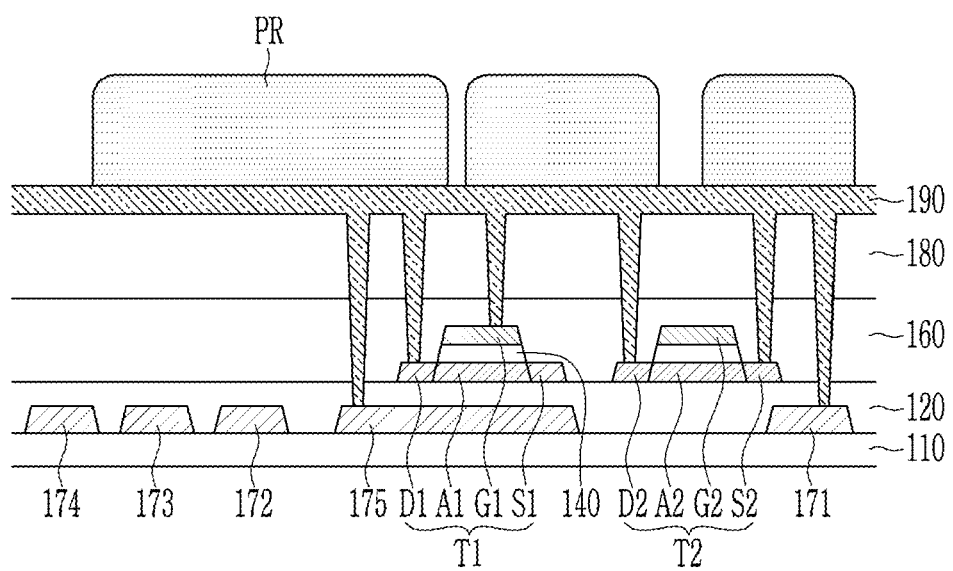

Referring to FIG. 12, a conductive material layer 190 including the first to fifth conductive material layers is formed on the fourth insulating layer 180. In this case, the conductive material layer 190 may be connected to the drain electrode D1 of the first transistor T1, the gate electrode G1 of the first transistor T1, the drain electrode D2 of the second transistor T2, and the source electrode S2 of the second transistor T2 through respective contact holes H82, H86, H87, and H85, of the fourth insulating layer 180 and the third insulating layer 160, and may be connected to the light blocking layer 175 and the data line 171 through the respective contact holes H83 and H84 of the fourth insulating layer 180, the third insulating layer 160, and the first insulating layer 120.

A photoresist is coated on the conductive material layer 190 and patterned, and a photolithography process using a photomask is performed to form a photosensitive film pattern PR. The photosensitive film pattern PR may overlap the third conductor.

Figure 13:
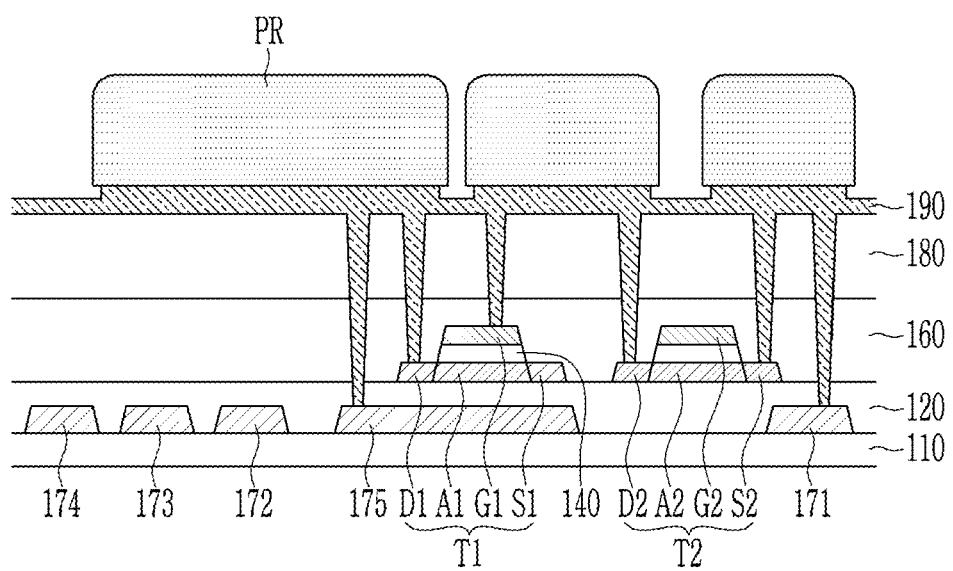

Referring to FIG. 13, the fifth conductive material layer and the fourth conductive material layer are first wet etched by the using photosensitive film pattern PR as a mask. A phosphoric acid, nitric acid, and acetic acid etchant may be used in the first wet etching. By the first wet etching, the fifth conductive material layer including silver (Ag) and the fourth conductive material layer including indium tin oxide (ITO) are etched, and the first to third conductive material layers are not etched and remain. Accordingly, in the conductive material layer 190, the first to fifth conductive material layers exist (e.g., are present) in the region overlapping the photosensitive film pattern PR, and the first to third conductive material layers exist (e.g., are present) in the region not overlapping (i.e., exposed by) the photosensitive film pattern PR.

Figure 14:
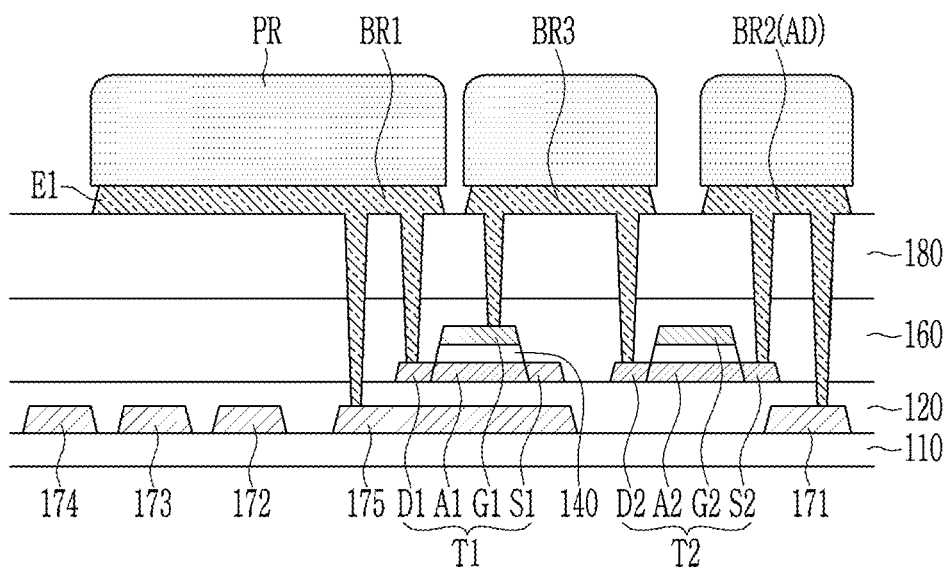

Referring to FIG. 14, the third conductive material layer, the second conductive material layer, and the first conductive material layer are secondarily wet etched by using the photosensitive film pattern PR as a mask. In the secondary wet etching, a non-hydrogen peroxide copper etchant may be used. By the secondary wet etching, the third conductive material layer including titanium (Ti), the second conductive material layer including copper (Cu), and the first conductive material layer including titanium (Ti) are etched. Accordingly, in the conductive material layer 190, the first to fifth conductive material layers exist (e.g., are present) in the region overlapping the photosensitive film pattern PR, and the first to fifth conductive material layers are removed in the region not overlapping (i.e., exposed by) the photosensitive film pattern PR, thereby forming the third conductor capable of including the pixel electrode E1, the first bridge BR1, the second bridge BR2, and the third bridge BR3.

Figure 15:
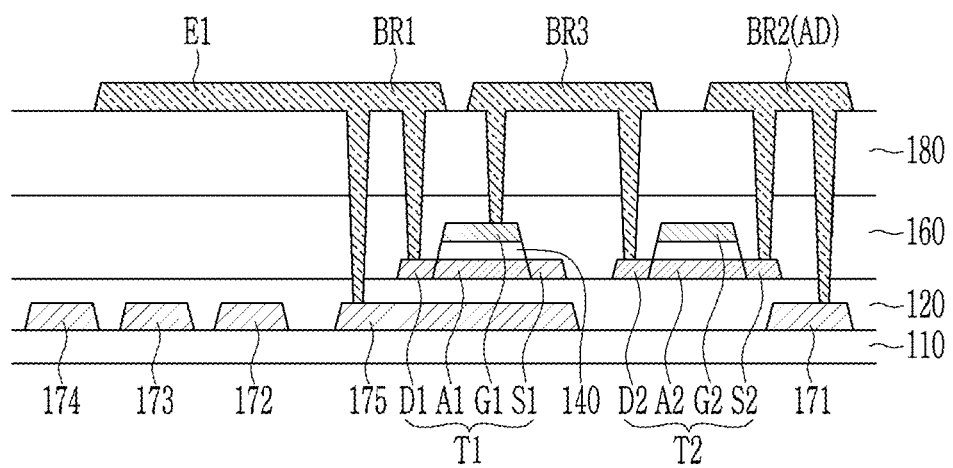

Referring to FIG. 15, the photosensitive film pattern PR disposed on the third conductor is removed by the strip process.

As above, the third conductor including the first to fifth layers L1 to L5 may be formed through two wet etchings, but may be formed using one photomask. The subsequent process is the same as that as described above with reference to the embodiment of FIG. 3. In manufacturing such a display device, six photomasks may be used, and two photomasks may be eliminated compared to a display device including the conductor between the fourth insulating layer 180 and the fifth insulating layer 360

Figure 16:
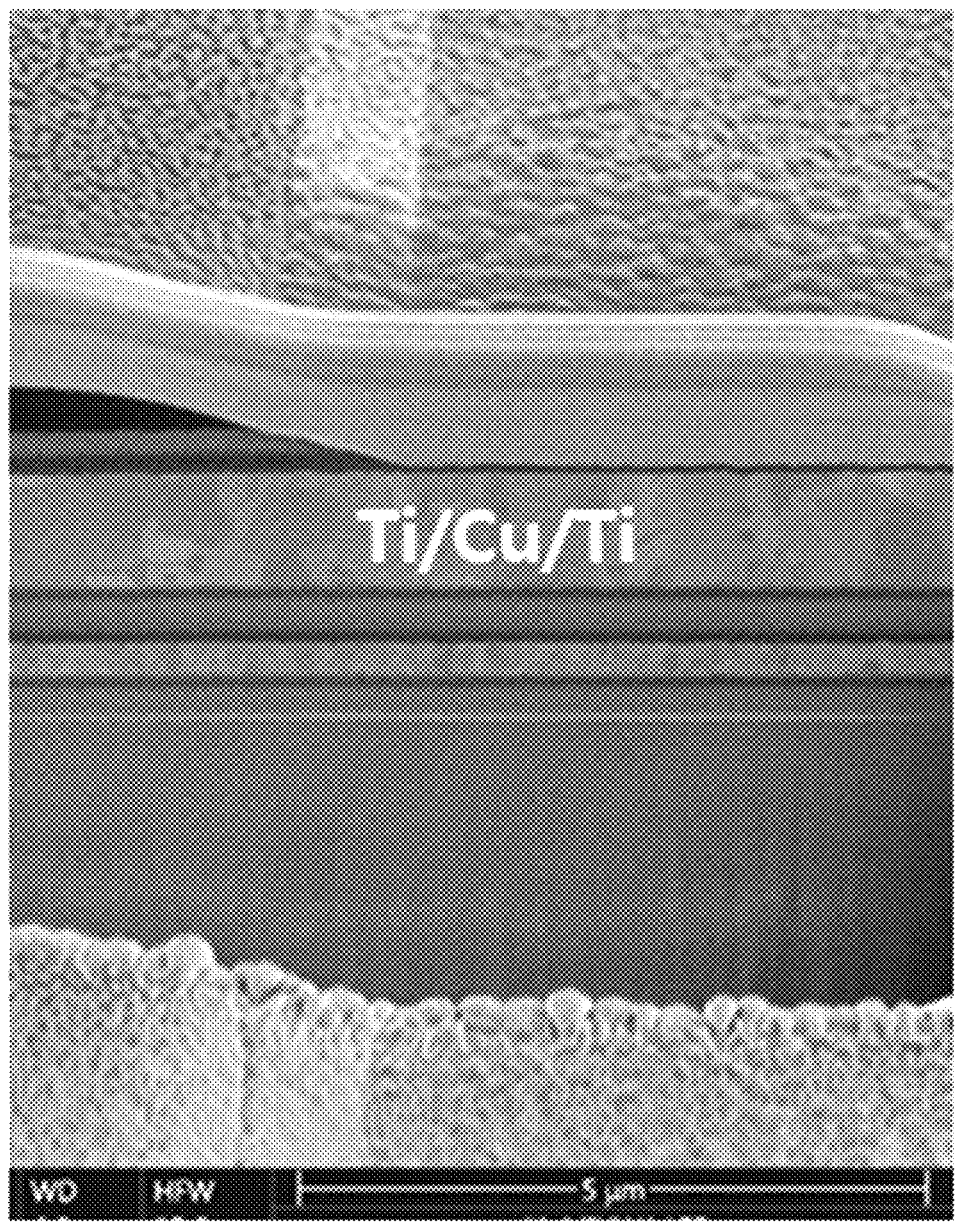
FIGS. 16 and 17 are electron micrographs of a conductor of titanium/copper/titanium.
Figure 17:
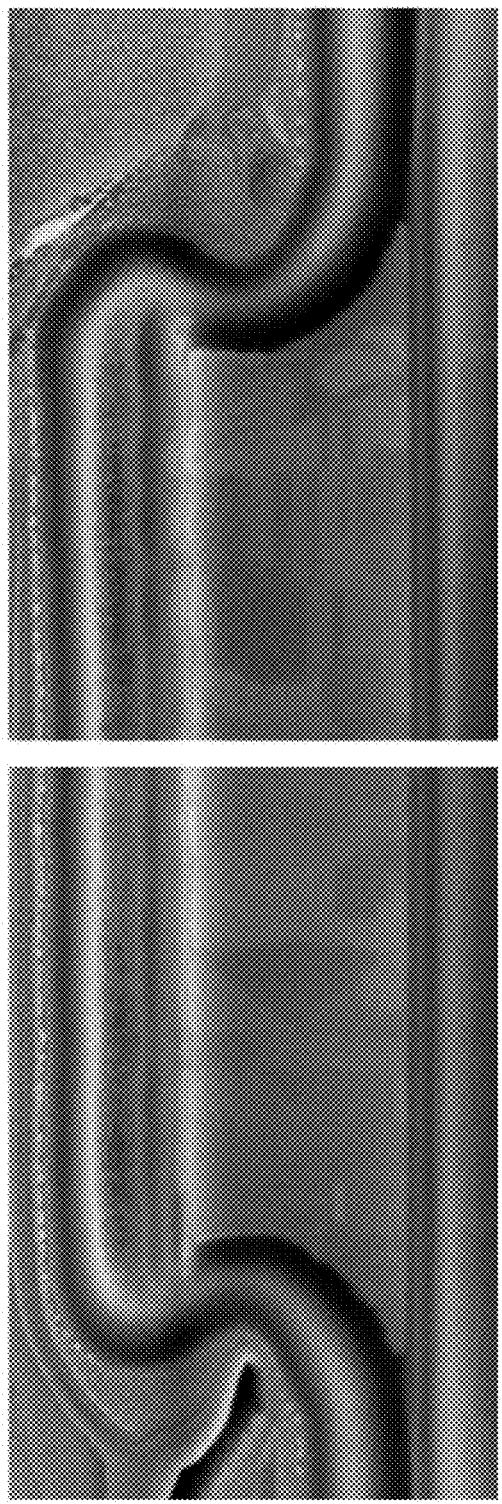

FIGS. 16 and 17 are electron micrographs of a conductor of titanium (Ti)/copper (Cu)/titanium (Ti).

Referring to FIG. 16, after forming a conductive layer stacked in the order of titanium (Ti), copper (Cu), titanium (Ti), silver (Ag), and ITO on an insulating layer, the ITO layer and the silver layer were etched with a phosphoric acid-nitric acid-acetic acid etchant. It was confirmed that there was no damage to the copper layer. This indicates that the copper layer is not damaged by the first etching in the process for forming the third conductor according to the embodiment.

Referring to FIG. 17, after forming conductive layers of titanium (Ti)/copper (Cu)/titanium (Ti) on an insulating layer, an etching estimation using the non-hydrogen peroxide etchant is shown. The titanium (Ti)/copper (Cu)/titanium (Ti) conductive layers were all etched and exhibited a good etching profile. This indicates that the titanium (Ti)/copper (Cu)/titanium (Ti) conductive layers are etched well by the secondary etching in the process for forming the third conductor according to the embodiment.

Figure 18:
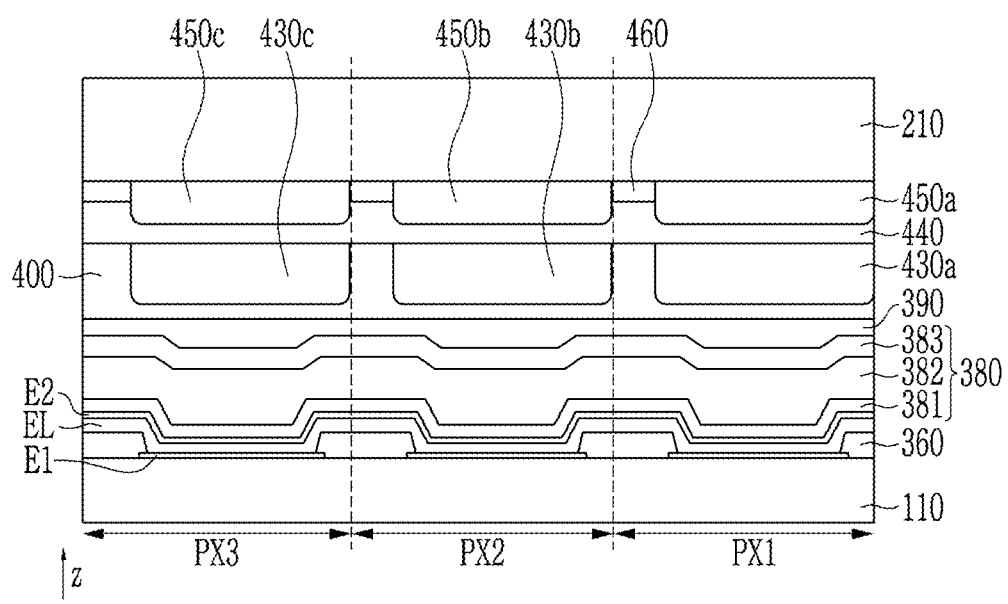
FIG. 18 is a cross-sectional view of a display device according to an embodiment.

FIG. 18 is a cross-sectional view of a display device according to an embodiment.

In the embodiment of FIG. 3 and the embodiment of FIG. 10, the common electrode E2 is disposed at the top. Constituent elements that may be disposed on the common electrode E2 in the display device according to an embodiment are described in more detail below with reference to FIG. 18.

Referring to FIG. 18, the display device may include pixels PX1, PX2, and PX3 that emit light of different colors A pixel electrode E1 of each pixel PX1, PX2, and PX3 may be disposed on the substrate 110. A fifth insulating layer 360 having an opening overlapping the pixel electrode E1 may be disposed on the substrate 110, and an emission layer EL and a common electrode E2 may be disposed on the pixel electrode E1 and the fifth insulating layer 360. The emission layer EL may include a light emitting material that emits a first color light, which may be blue light. The insulating layers and the conductors disposed between the substrate 110 and the pixel electrode E1, the auxiliary data pattern disposed on the same layer as the pixel electrode E1, conductors such as the bridges and the like are omitted in FIG. 18, however they may be disposed as shown in FIG. 3 or FIG. 10.

An encapsulation layer 380 may be disposed on the common electrode E2. The encapsulation layer 380 may be a thin film encapsulation layer including inorganic insulating layers 381 and 383 and an organic insulating layer 382.

A filling layer 390 including a filler may be positioned on the encapsulation layer 380. A cover layer 400 including an insulating material, color conversion layers 430a and 430b, and a transmission layer 430c may be disposed on the filling layer 390.

The transmission layer 430c may transmit the first color light, which may be blue light. The transmission layer 430c may include a polymer material that transmits the first color light. The region where the transmission layer 430c is disposed may correspond to a light emitting region emitting blue light. The transmission layer 430c does not include semiconductor nanocrystals and may pass incident first color light as it is.

The color conversion layers 430a and 430b may include different semiconductor nanocrystals. For example, the first color light incident on the color conversion layer 430a may be converted into a second color light and emitted by the semiconductor nanocrystals included in the color conversion layer 430b. The first color light incident on the color conversion layer 430b may be converted into a third color light and emitted by the semiconductor nanocrystals included in the color conversion layer 430b.

The semiconductor nanocrystals may include at least one of a phosphor or a quantum dot material that converts incident first color light into second color light or third color light.

The quantum dots may include a Group II-VI compound, a Group III-V compound, a Group IV-VI compound, a Group IV element or compound, a Group I-III-VI compound, a Group II-III-VI compound, a Group I-II-IV-VI compound, or one or more combinations thereof.

The Group II-VI compound may be selected from a group including a binary compound selected from a group consisting of CdSe, CdTe, ZnS, ZnSe, ZnTe, ZnO, HgS, HgSe, HgTe, MgSe, MgS, and mixtures thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof. The Group II-VI compound may further include a Group III metal.

The Group III-V compound may be selected from a group including a binary compound selected from a group consisting of GaN, GaP, GaAs, GaSb, AlN, AlP, AlAs, AlSb, InN, InP, InAs, InSb, and mixtures thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and mixtures thereof; and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and mixtures thereof The Group III-V compound may further include a Group II metal (e.g., InZnP).

The Group IV-VI compound may be selected from a group including a binary compound selected from a group consisting of SnS, SnSe, SnTe, PbS, PbSe, PbTe, and mixtures thereof; a ternary compound selected from a group consisting of SnSeS, SnSeTe, SnSTe, PbSeS, PbSeTe, PbSTe, SnPbS, SnPbSe, SnPbTe, and mixtures thereof; and a quaternary compound selected from a group consisting of SnPbSSe, SnPbSeTe, SnPbSTe, and mixtures thereof.

The Group IV element or compound may be selected from a group including a single element compound selected from a group consisting of Si, Ge and combinations thereof; and a binary element compound selected from a group consisting of SiC, SiGe, and combinations thereof.

The Group I-III-VI compound may be selected from $CuInSe_2$, $CuInS_2$, CuInGaSe, and CuInGaS.

The Group II-III-VI compound may be selected from a group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and combinations thereof.

The Group I-II-IV-VI may be selected from CuZnSnSe and CuZnSnS.

The quantum dots may not contain cadmium. The quantum dots may include a semiconductor nanocrystal based on a Group III-V compound including indium and phosphorus. The Group III-V compound may further include zinc. The quantum dots may include a semiconductor nanocrystal based on a Group II-VI compound including a chalcogen element (e.g., sulfur, selenium, tellurium, or one or more combinations thereof) and zinc.

In the quantum dots, the binary compound, the ternary compound, or the quaternary compound as above-described may be present in the particle at a uniform concentration or in the same particle of which a concentration distribution may be partially divided into different states. Also, they may have a core/shell structure in which one quantum dot surrounds another quantum dot. The interface between the core and the shell may have a concentration gradient in which the concentration of the elements present in the shell decreases toward the center.

In some embodiments, the quantum dots may have a core-shell structure including a core including the above-described nanocrystal and a shell surrounding the core. The shell of the quantum dot may act as a protective layer for maintaining the semiconductor characteristic by preventing or substantially preventing a chemical modification of the core and/or a charging layer for imparting an electrophoretic characteristic to the quantum dot. The shell can be a single-layer shell or a multi-layer shell. The interface between the core and the shell may have a concentration gradient in which the concentration of elements present in the shell decreases toward the center (e.g., the core). Examples of the shell of the quantum dot include a metal or non-metal oxide, a semiconductor compound, or a combination thereof.

For example, the metal or non-metal oxide may be exemplified as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$.

Also, the semiconductor compound may be exemplified as CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

The quantum dots may have a full width at half maximum (FWHM) of about 45 nm or less, preferably about 40 nm or less, more preferably about 30 nm or less, and may improve color purity or color reproducibility in this range. Also, because light emitted through the quantum dots is emitted in all directions, a wide viewing angle may be improved.

In the quantum dots, the shell material and the core material may have different energy bandgaps from each other. For example, the energy bandgap of the shell material may be greater or smaller than that of the core material. The quantum dots may have a multi-layer shell. In the multi-layer shell, the energy bandgap of the outer layer may be greater than the energy bandgap of the inner layer (i.e., the layer nearer to the core. In the multi-layer shell, the energy bandgap of the outer layer may be less than the energy bandgap of the inner layer.

The shapes of the quantum dots are not particularly limited. For example, the shape of the quantum dots may be any suitable shape such as, for example, a sphere, a polyhedron, a pyramid, a multipod, a square, a rectangular parallelepiped, a nanotube, a nanorod, a nanowire, a nanosheet, or a combination thereof.

The quantum dots may include an organic ligand (e.g., having a hydrophobic moiety). The organic ligand moiety may be bound to surfaces of the quantum dots. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or one or more combinations thereof. Herein, R is independently a C3 to C40 substituted or unsubstituted aliphatic hydrocarbon group such as a C3 to C40 (e.g., C5 or greater and C24 or smaller) substituted or unsubstituted alkyl, or a substituted or unsubstituted alkenyl, a C6 to C40 (e.g., C6 or greater and C20 or smaller) substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; a phosphine compound or an oxide compound thereof such methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, or trioctylphosphine oxide; a diphenyl phosphine, triphenyl phosphine compound, or an oxide compound thereof; a C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid; and/or the like, but are not limited thereto. The quantum dots may include a hydrophobic organic ligand alone or in a mixture of at least two types. The hydrophobic organic ligand may not include a photopolymerizable moiety (e.g., an acrylate group, a methacrylate group, etc.).

The quantum dots may control a color of emitted light according to a particle size thereof, and thus the quantum dots may have various light emitting colors such as blue, red, and green colors.

An insulating layer 440 may be disposed on the color conversion layers 430a and 430b and the transmission layer 430c. Color filters 450a, 450b, and 450c and a light blocking member 460 may be disposed on the insulating layer 440. The color filter 450a may represent the second color light, the color filter 450b may represent the third color light, and the color filter 450c may represent the first color light.

The light blocking member 460 may be disposed between adjacent color filters 450a, 450b, and 450c.

A substrate 210 may be disposed on the color filters 450a, 450b, and 450c and the light blocking member 460. Therefore, the color conversion layers 430a and 430b and the color filters 450a, 450b, and 450c may be disposed between the substrate 110 and the substrate 210.

The display device may not include the color conversion layers 430a and 430b and the transmission layer 430c, and the emission layer EL may include the quantum dots.

While the present disclosure has been particularly shown and described with reference to some example embodiments thereof, it is to be understood that the present disclosure is not limited to the disclosed embodiments. On the contrary, it is intended to cover various modifications and equivalent arrangements included within the spirit and scope of the present disclosure as set forth in the following claims, and equivalents thereof.

What is claimed is:

1. A display device comprising:
   a substrate;
   a data line on the substrate;
   a first insulating layer on the data line;
   a first transistor on the first insulating layer;
   a second transistor on the first insulating layer;
   a second insulating layer on the first transistor;
   a pixel electrode on the second insulating layer, the pixel electrode being electrically connected to the first transistor;
   an auxiliary data pattern on the second insulating layer as a same layer as the pixel electrode, the auxiliary data pattern being electrically connected to the data line;
   a light blocking layer between the substrate and the first insulating layer, the light blocking layer overlapping a channel region of the first transistor; and a first bridge on the second insulating layer as a same layer as the pixel electrode, the first bridge being connected to the pixel electrode, an electrode of the first transistor, and the light blocking layer, wherein the display device further comprises a data driver to apply a data voltage to the data line, and the data line is to transmit the data voltage to the second transistor.

2. The display device of claim 1, further comprising:

a first connecting member on the first insulating layer, the first connecting member being connected to the electrode of the first transistor; and a third insulating layer between the first connecting member and the second insulating layer, wherein the pixel electrode is connected to the first transistor through the first connecting member.

3. The display device of claim 2, wherein the first connecting member is connected to the light blocking layer.

4. The display device of claim 2, further comprising:

a second connecting member between the first insulating layer and the third insulating layer, the second connecting member being connected to an electrode of the second transistor and the data line, wherein the auxiliary data pattern is connected to the data line through the second connecting member.

5. The display device of claim 4, wherein the auxiliary data pattern is connected to the second connecting member through a contact hole formed in the third insulating layer.

6. The display device of claim 1, further comprising:

a second bridge on the same layer as the pixel electrode on the second insulating layer, the second bridge being connected to an electrode of the second transistor and the data line.

7. The display device of claim 6, further comprising a third bridge on the second insulating layer as a same layer as the pixel electrode, the third bridge being connected to an other electrode of the first transistor and an other electrode of the second transistor.

8. The display device of claim 1, wherein:

the pixel electrode and the auxiliary data pattern comprise a plurality of layers, and at least one layer from among the plurality of layers comprises copper.

9. A display device comprising:

a substrate;

a data line on the substrate;

a first insulating layer on the data line;

a first transistor on the first insulating layer;

a second insulating layer on the first transistor;

a pixel electrode on the second insulating layer, the pixel electrode being electrically connected to the first transistor; and an auxiliary data pattern on the second insulating layer as a same layer as the pixel electrode, the auxiliary data pattern being electrically connected to the data line, wherein the pixel electrode and the auxiliary data pattern comprise a plurality of layers, and at least one layer from among the plurality of layers comprises copper, the plurality of layers comprises a first layer, a second layer, a third layer, a fourth layer, and a fifth layer sequentially disposed on the second insulating layer, and the second layer comprises copper.

10. The display device of claim 9, wherein the first layer comprises titanium or a copper alloy, the third layer comprises titanium, the fourth layer comprises silver, and the fifth layer comprises a transparent conductive oxide.

11. A display device comprising:

a substrate;

a first conductor on and above the substrate, the first conductor comprising a light blocking layer and a data line;

a first insulating layer on and above the first conductor;

a semiconductor layer on and above the first insulating layer;

a second insulating layer on the semiconductor layer;

a second conductor on the second insulating layer, the second conductor comprising a first gate electrode and a second gate electrode;

a third insulating layer on the second conductor;

a fourth insulating layer on the third insulating layer;

a third conductor on the fourth insulating layer, the third conductor comprising a pixel electrode and an auxiliary data pattern;

a fifth insulating layer on the third conductor, the fifth insulating layer having an opening overlapping the pixel electrode;

an emission layer on the pixel electrode; and a common electrode on the emission layer, wherein:

the pixel electrode is electrically connected to the light blocking layer, and the auxiliary data pattern is electrically connected to the data line.

12. The display device of claim 11, further comprising:

a first transistor between the first insulating layer and the third insulating layer, the first transistor comprising a part of the semiconductor layer and the first gate electrode;

a second transistor between the first insulating layer and the third insulating layer, the second transistor comprising a part of the semiconductor layer and the second gate electrode; and a first connecting member between the first insulating layer and the third insulating layer, the first connecting member being connected to an electrode of the first transistor, wherein the pixel electrode is connected to the electrode of the first transistor through the first connecting member.

13. The display device of claim 12, wherein:

the first connecting member is connected to the light blocking layer through a contact hole formed in the first insulating layer, and the pixel electrode is connected to the first connecting member through a contact hole formed in the third insulating layer and the fourth insulating layer.

14. The display device of claim 12, further comprising a second connecting member between the first insulating layer and the third insulating layer and connected to an electrode of the second transistor, wherein the auxiliary data pattern is connected to the data line through the second connecting member.

15. The display device of claim 14, wherein:

the second connecting member is connected to the data line through a contact hole formed in the first insulating layer, and the auxiliary data pattern is connected to the second connecting member through a contact hole formed in the third insulating layer and the fourth insulating layer.

16. The display device of claim 12, wherein the third conductor further comprises:
- a first bridge connected to the electrode of the first transistor and the light blocking layer; and
- a second bridge connected to an electrode of the second transistor and the data line.

17. The display device of claim 11, wherein:
the third conductor further comprises a first layer, a second layer, a third layer, a fourth layer, and a fifth layer sequentially located on the fourth insulating layer, and
the second layer comprises copper.

18. The display device of claim 17, wherein
the first layer comprises titanium or a copper alloy, the third layer comprises titanium, the fourth layer comprises silver, and the fifth layer comprises a transparent conductive oxide.

* * * * *